(12) United States Patent
Pei

(10) Patent No.: US 11,023,061 B2
(45) Date of Patent: Jun. 1, 2021

(54) PANEL WITH MULTIPLE CONDUCTIVE PATTERNS

(71) Applicant: AU Optronics Corporation, Hsin-Chu (TW)

(72) Inventor: Kai Pei, Hsin-Chu (TW)

(73) Assignee: AU OPTRONICS CORPORATION, Hsin-Chu (TW)

(*) Notice: Subject to any disclaimer, the term of this patent is extended or adjusted under 35 U.S.C. 154(b) by 140 days.

(21) Appl. No.: 16/539,415

(22) Filed: Aug. 13, 2019

(65) Prior Publication Data

US 2019/0369789 A1 Dec. 5, 2019

Related U.S. Application Data

(62) Division of application No. 15/790,135, filed on Oct. 23, 2017, now Pat. No. 10,429,976.

(30) Foreign Application Priority Data

Jan. 25, 2017 (TW) ................................ 106103001

(51) Int. Cl.
| | |
|---|---|
| *G06F 3/041* | (2006.01) |
| *H01L 27/02* | (2006.01) |
| *H01L 27/10* | (2006.01) |
| *G06F 3/02* | (2006.01) |
| *G06F 3/044* | (2006.01) |

(52) U.S. Cl.
CPC .......... *G06F 3/0412* (2013.01); *G06F 3/0202* (2013.01); *G06F 3/0445* (2019.05); *H01L 27/0207* (2013.01); *H01L 27/10* (2013.01); *G06F 2203/04103* (2013.01); *G06F 2203/04111* (2013.01)

(58) Field of Classification Search
CPC ....... G02F 1/13338; G06F 2203/04103; G06F 2203/04111; G06F 3/0202; G06F 3/0412; G06F 3/044; H01L 27/0207; H01L 27/10
USPC .......................................................... 257/499
See application file for complete search history.

(56) References Cited

U.S. PATENT DOCUMENTS

| | | | |
|---|---|---|---|
| 2003/0122179 A1* | 7/2003 | Matsuki ............ H01L 21/76834 257/314 |
| 2010/0134436 A1* | 6/2010 | Jeong ..................... G06F 3/0446 345/174 |
| 2010/0149117 A1* | 6/2010 | Chien ............... G02F 1/133514 345/173 |
| 2013/0135224 A1* | 5/2013 | Lee ........................ G06F 3/0443 345/173 |
| 2014/0340592 A1* | 11/2014 | Lin ....................... G06F 3/0446 349/12 |

(Continued)

*Primary Examiner* — Duy T Nguyen
(74) *Attorney, Agent, or Firm* — WPAT, PC

(57) ABSTRACT

A panel is provided, including a first conductive pattern and a second conductive pattern. The first conductive pattern includes a first portion and a second portion; the second conductive pattern connects the first portion to the second portion, and an insulation pattern substantially covering a side surface of the second conductive pattern. The insulation pattern is formed by thermally treating a mask pattern of an insulation material. A horizontal distance between an outer side surface of the insulation pattern and an inner side surface adjacent to the second conductive pattern is less than 3 micrometers.

13 Claims, 6 Drawing Sheets

(56) References Cited

U.S. PATENT DOCUMENTS

2015/0168763 A1* 6/2015 Kim .................... G02F 1/1362
349/42

* cited by examiner

PANEL WITH MULTIPLE CONDUCTIVE PATTERNS

BACKGROUND

Technical Field

The present invention generally relates to a panel and a manufacturing method thereof, specifically, to a panel whose manufacturing procedures are simplified and light reflection is improved, and a manufacturing method thereof.

Related Art

Touch panels may be classified into resistive touch panels, capacitive touch panels, optical touch panels, sound wave touch panels, electromagnetic touch panels, and the like, according to different sensing principles. Because capacitive touch panels have advantages such as short response time, high sensitivity, good reliability and high durability, the capacitive touch panels are widely used currently.

Touch lines of a capacitive touch panel mainly include drive lines (Tx) and sensing lines (Rx), which are respectively distributed on an entire panel horizontally and vertically in an intersecting and dense manner. The drive lines and sensing lines form a capacitor structure, and a touch position can be calculated according to a capacitance change caused by touch.

According to a composition manner, capacitive touch panels may be divided into an externally-attached type and a built-in type (integrated type). Externally-attached capacitive touch panels are generally made by first making touch lines on a touch substrate, and then attaching the touch substrate on which the touch lines have been made to an outer surface of a display. Built-in capacitive touch panels are generally made by integrating touch lines in a color filter substrate structure of a display. However, it is known that in the method of integrating touch lines in a color filter substrate structure, generally, additional light shield programs are needed after the metal lines are completed, to form a light shield layer, so as to improve the light reflection problem of the metal lines, and consequently, complexity and difficulty of manufacturing procedures are further raised.

Therefore, how to simplify manufacturing programs of touch lines and further solve the light reflection problem of metal lines at the same time is one of important research and development directions of touch panel designs.

SUMMARY

One of the objectives of the present invention lies in providing a panel and a manufacturing method thereof; according to one embodiment of the present invention, a mask pattern used in a patterning step is used as an insulation layer that isolates a bridging portion of adjacent conductive electrodes, so as to effectively simplify manufacturing steps of a touch line.

Another objective of the present invention lies in providing a panel and a manufacturing method thereof; according to one embodiment of the present invention, a mask pattern used in a patterning step is used as a light shield layer of a metal line, so as to effectively simplify manufacturing steps, save material costs, and improve light reflection of the metal line.

Another objective of the present invention lies in providing a panel and a manufacturing method thereof; according to one embodiment of the present invention, a metal layer of a peripheral circuit is used as a bridging portion of adjacent conductive electrodes to effectively reduce a resistance value.

An embodiment of the present invention provides a method for manufacturing a panel, comprising: forming a first conductive pattern comprising a first portion and a second portion; forming a second conductive pattern connecting between the first portion and the second portion; and thermally treating a mask pattern of an insulation material to form an insulation pattern substantially covering a side surface of the second conductive pattern.

In an embodiment, the step of forming the second conductive pattern comprises: forming a second conductive layer on the first conductive pattern, to cover the first portion and the second portion; forming the mask pattern on the second conductive layer, the mask pattern defining the second conductive pattern; and etching the second conductive layer by using the mask pattern as a mask, to form the second conductive pattern.

In an embodiment, the etching the second conductive layer comprises wet-etching the second conductive layer, so that the second conductive pattern retracts relative to the mask pattern to form an undercutting space under the mask pattern.

In an embodiment, thermally treating the mask pattern comprises thermally reflowing the mask pattern to fill the undercutting space.

In an embodiment, the undercutting space is not filled up by the insulation material, to form at least one remaining space adjacent to a side edge of the insulation pattern and a side edge of the second conductive pattern.

Another embodiment of the present invention provides a panel manufactured by using the foregoing method, wherein a horizontal distance between an outer side surface of the insulation pattern and an inner side surface adjacent to the second conductive pattern is less than 3 micrometers.

In an embodiment, the second conductive pattern comprises a first bridging portion connecting between the first portion and the second portion; the insulation pattern comprises a first insulation portion located on the first bridging portion and substantially covering a side surface of the first bridging portion; a horizontal distance between an outer side surface of the first insulation portion and an inner side surface adjacent to the first bridging portion is less than 3 micrometers; the panel further comprises a third conductive pattern comprising two first sensing portions, two second sensing portions, and a second bridging portion; the two first sensing portions are respectively electrically connected to the first portion and the second portion; the second bridging portion at least partially crosses over the first insulation portion; and the second bridging portion is connected to the two second sensing portions. In an embodiment, the first conductive pattern and the third conductive pattern comprise transparent conductive materials.

In an embodiment, the first conductive pattern further comprises a third portion and a fourth portion; the second conductive pattern further comprises a line portion connected to the third portion and the fourth portion; and the insulation pattern further comprises a second insulation portion located on the line portion and substantially covering a side surface of the line portion. In an embodiment, the third conductive pattern further comprises a connection portion and a pad portion; the connection portion is connected to the third portion and one of the two first sensing portions; and the pad portion is electrically connected to the fourth portion.

In an embodiment, the panel further comprises a third conductive pattern, wherein the first conductive pattern further comprises a third portion and a fourth portion; the third conductive pattern at least partially crosses over the insulation pattern, and the third conductive pattern is electrically connected to the third portion and the fourth portion. In an embodiment, the first conductive pattern comprises a transparent conductive material, and the third conductive pattern comprises a transparent conductive material or a metal material.

In an embodiment, the second conductive pattern comprises a first bridging portion connecting between the first portion and the second portion; the insulation pattern comprises a first insulation portion located on the first bridging portion and substantially covering a side surface of the first bridging portion; a horizontal distance between an outer side surface of the first insulation portion and an inner side surface adjacent to the first bridging portion is less than 3 micrometers; the first conductive pattern further comprises a connection portion and a first pad portion; the connection portion is connected to one of the first portion and the second portion; the second conductive pattern further comprises a line portion connected to the connection portion and the first pad portion; the insulation pattern further comprises a second insulation portion; the second insulation portion is located on the line portion and substantially covers a side surface of the line portion.

In an embodiment, the third conductive pattern comprises a second bridging portion; the second bridging portion at least partially crosses over the first insulation portion and is connected to the third portion and the fourth portion; and the third conductive pattern further comprises a second pad portion electrically connected to the first pad portion. In an embodiment, the first conductive pattern comprises a transparent conductive material, and the second conductive pattern comprises a metal material.

In an embodiment, the insulation pattern comprises a black photoresist material.

In an embodiment, at least one remaining space is formed adjacent to a side edge of the insulation pattern and a side edge of the second conductive pattern.

DETAILED DESCRIPTION

Figure 1:
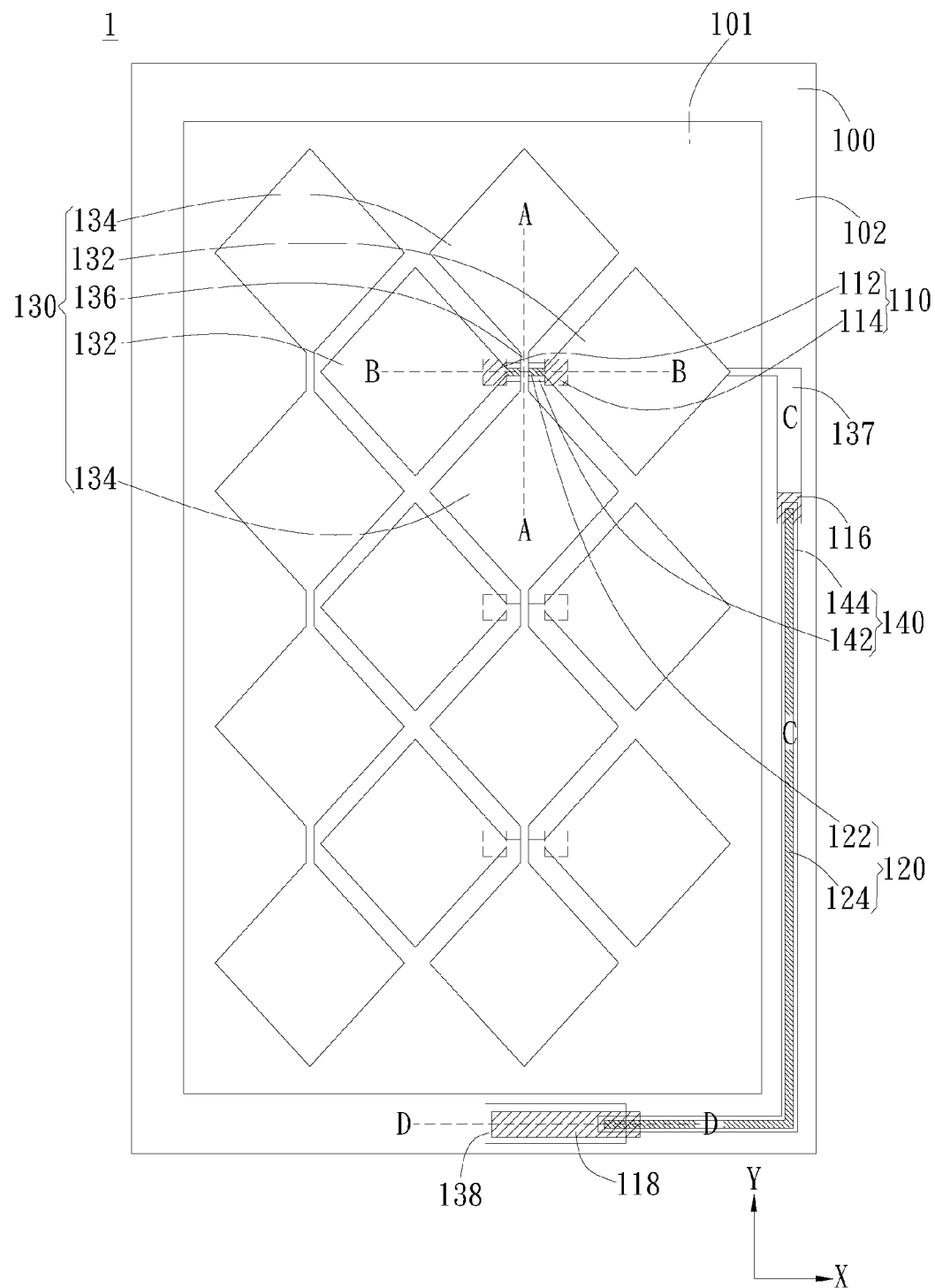
FIG. 1 is a schematic diagram of a panel of an embodiment of the present invention.
Figure 2A:
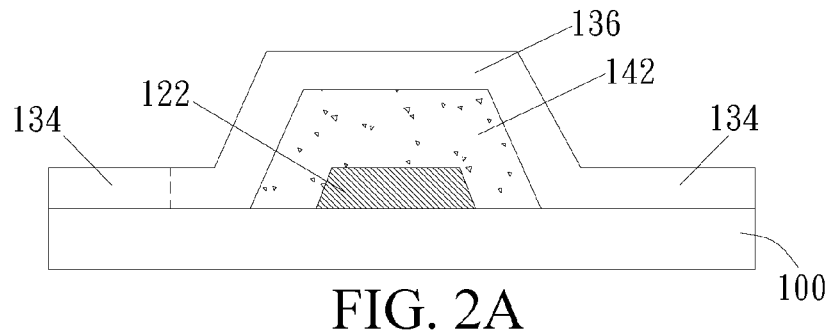
FIG. 2A to FIG. 2D respectively are schematic sectional views along lines AA, BB, CC, and DD of FIG. 1.
Figure 2B:
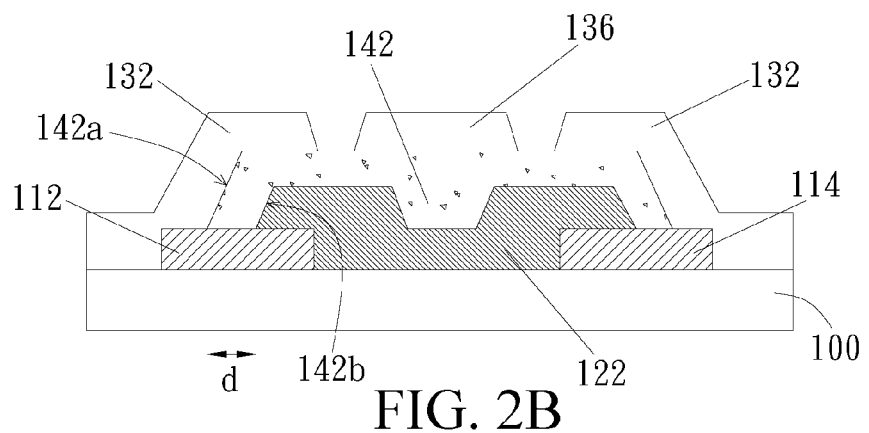
Figure 2C:
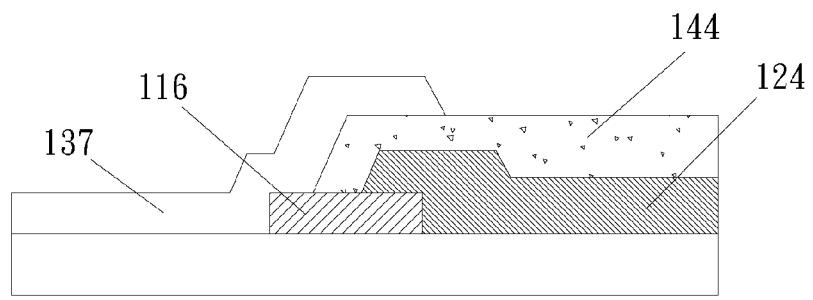
Figure 2D:
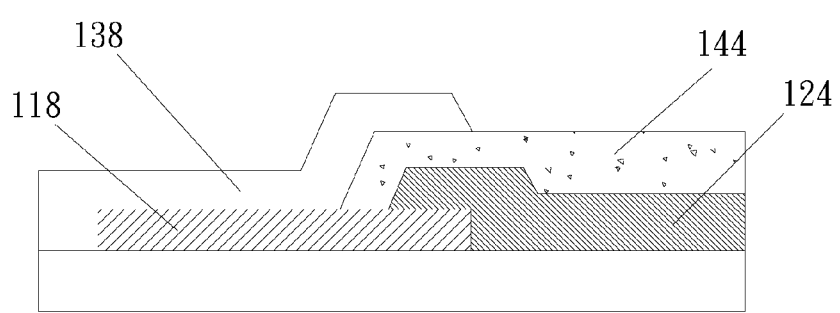

The present invention provides a panel and a manufacturing method thereof, in particular, a panel whose manufacturing steps are effectively simplified and material costs are effectively saved and a manufacturing method thereof; according to one embodiment of the present invention, a mask pattern used in a patterning step is used as an insulation layer of a bridging portion of adjacent conductive electrodes and/or a light shield layer of a metal line, so as to effectively simplify manufacturing steps, save material costs, and improve light reflection of the metal line. Specifically, the panel of the present invention may be any panel that needs an insulation layer to isolate lines, for example, a touch panel, or a touch display panel that integrates touch and display functions, but the present invention is not limited thereto. Subsequently, details of a panel and a manufacturing method thereof of embodiments of the present invention are described in detail with reference to the drawings by using a touch panel as an example.

In an embodiment, as shown in FIG. 1 and FIG. 2A-2D, a panel 1 comprises a first conductive pattern 110, a second conductive pattern 120, a third conductive pattern 130, and an insulation pattern 140. Specifically, the first conductive pattern 110 is located on a substrate 100, which, for example, is an insulation substrate made of a polymer or glass, or a manufacturing substrate of any suitable phase in display panel manufacturing procedures, for example, a color array substrate. In this embodiment, the substrate 100 comprises a sensing area 101 and a peripheral circuit area 102. The peripheral circuit area 102, for example, surrounds the sensing area 101. Touch lines are provided in the sensing area 101, and fanout lines are provided in the peripheral circuit area 102.

The first conductive pattern 110 may comprise a plurality of first portions 112 and a plurality of second portions 114. For example, the plurality of first portions 112 and the plurality of second portions 114 are provided in pairs in the sensing area 101 of the substrate 100. One first portions 112 and one second portions 114 constitute a pair. Each pair of the first portion 112 and the second portion 114 may be used as electric contacts of adjacent touch electrodes of a touch panel. In addition, the first conductive pattern 110 may further comprise a third portion 116 and a fourth portion 118. The third portion 116 and the fourth portion 118 may be provided in the peripheral circuit area 102 as electric contacts of peripheral circuits of the panel. For example, the third portion 116 is used as an electric contact for a fan-out area of the panel, and the fourth portion 118 is used as an electric contact of a connection pad of the panel. The first conductive pattern 110 preferably is made by material comprising a transparent conductive material, for example, an indium tin oxide (ITO) or an indium zinc oxide (IZO).

The second conductive pattern 120 connects between the first portion 112 and the second portion 114. Specifically, the second conductive pattern 120 is located on the substrate 100, and may comprise a plurality of first bridging portions 122. The plurality of first bridging portions 122 is located in the sensing area 101 of the substrate 100, and one first bridging portion 122 is configured to connect between one pair of the first portion 112 and the second portion 114. That is, the first bridging portion 122 is located between the corresponding first portion 112 and second portion 114; and preferably, two ends of the first bridging portion 122 are respectively partially covered on adjacent sides of the first portion 112 and the second portion 114 to be electrically connected to the first portion 112 and the second portion 114. In addition, the second conductive pattern 120 further comprises a line portion 124, configured to be connected to the third portion 116 and the fourth portion 118. For example, the line portion 124 is located in the peripheral circuit area 102 of the substrate 100, and is used as a line that connects the electric contact of the fan-out area (that is, the third portion 116) to the electric contact of the connection pad (that is, the fourth portion 118). That is, the line portion 124 is located between the corresponding third portion 116 and fourth portion 118; and preferably, two ends of the line portion 124 are respectively partially covered on corresponding side edges of the third portion 116 and the fourth portion 118 to be electrically connected to the third portion 116 and the fourth portion 118. The second conductive pattern 120, for example, comprises a metal material, for example, copper, aluminum, titanium, molybdenum, silver, or gold, to reduce a resistance value of the bridging portion 122 that connects between adjacent electric contacts (for example, 112 and 114) or the line portion 124 connected to electric contacts (for example, 116 and 118). In other words, according to the present invention, by using a metal layer that forms peripheral circuits and is also used as a bridging portion that connects between electric contacts of adjacent touch electrodes, a resistance value of the bridging portion is effectively reduced in a case in which manufacturing procedures are not additionally added, and manufacturing steps are simplified.

The insulation pattern 140 is located on the second conductive pattern 120 and substantially covers a side surface of the second conductive pattern 120, and a horizontal distance d between an outer side surface 142a of the insulation pattern 140 and an inner side surface 142b adjacent to the second conductive pattern 120 is less than about 3 micrometers. Specifically, the insulation pattern 140 may comprise a plurality of first insulation portions 142, and each insulation portion 142 is located on the corresponding first bridging portion 122 and substantially covers a side surface of the first bridging portion 122, to isolate electric contact between the first bridging portion 122 and subsequent other conductive layers. A horizontal distance between an outer side surface 142a of the first insulation portion 142 and an inner side surface 142b adjacent to the corresponding first bridging portion 122 is less than about 3 micrometers, and the first insulation portion 142 does not completely cover the first portion 112 and the second portion 114, so that uncovered portions of the first portion 112 and the second portion 114 may be electrically connected to subsequent other conductive layers.

In addition, the insulation pattern 140 may further comprise a second insulation portion 144 located on the line portion 124 and substantially covering a side surface of the line portion 124. A horizontal distance between an outer side surface of the second insulation portion 144 and an inner side surface adjacent to the line portion 124 may also be less than about 3 micrometers, and the second insulation portion 144 does not completely cover the third portion 116 and the fourth portion 118, so that uncovered portions of the third portion 116 and the fourth portion 118 may be electrically connected to subsequent other conductive layers. The insulation pattern 140 preferably is formed by thermally treating a mask pattern of an insulation material used for patterning the second conductive pattern 120, to simplify manufacturing steps and saving material costs (described in detail subsequently). In this embodiment, the insulation pattern 140, for example, is a black photoresist material or an anti-reflection material. The anti-reflection material reduces light reflection by using light scattering or interference principles. The insulation pattern 140, for example, made by a material including a pigment, a dye, carbon black, a carbon nanotube, titanium nitride, a quantum dot, and zirconia, but the present invention is not limited thereto, so that the insulation pattern 140 not only can be used as an insulation layer for the first bridging portion 122, but also can be used as a light shield layer to reduce light reflection phenomenon of the metal line portion 124.

The third conductive pattern 130 is located on the substrate 100, and comprises a plurality of first sensing portions 132, a plurality of second sensing portions 134, and a plurality of second bridging portions 136, wherein two adjacent first sensing portions 132 are respectively electrically connected to the corresponding first portion 112 and the second portion 114. The second bridging portion 136 at least partially crosses over and contacts the corresponding first insulation portion 142, and second bridging portion 136 is connected to two adjacent second sensing portions 134. Specifically, the two adjacent first sensing portions 132 are respectively provided on opposite two ends of the first bridging portion 122 in a first direction X, to be electrically connected to portions that are not covered by the first insulation portion 142 of the first portion 112 and the second portion 114, so that the two adjacent first sensing portions 132 are electrically connected to each other via the first bridging portion 122, to be used as, for example, a drive line (Tx) extending along the first direction X of a touch line. The two adjacent second sensing portions 134 are respectively provided on opposite two sides of the first bridging portion 122 in a second direction Y, and are electrically connected to each other by the second bridging portion 136 that crosses over the first insulation portion 122, to be used as, for example, a sensing line (Rx) extending along the second direction Y of the touch line.

In addition, the third conductive pattern 130 may further comprise a connection portion 137 and a pad portion 138. The connection portion 137 and the pad portion 138 preferably are located in the peripheral circuit area 102 of the substrate 100; the connection portion 137 is connected to one of the third portion 116 and the first sensing portion 132, and the pad portion 138 is electrically connected to the fourth portion 118. Specifically, the connection portion 137 and the pad portion 138 are respectively electrically connected to portions that are not covered by the second insulation portion 144 of the third portion 116 and the fourth portion 118, to be electrically connected to the line portion 124, and used as, for example, an output line in the peripheral circuit area 102. The third conductive pattern 130 may be made by a material comprising a transparent conductive material, for example, an indium tin oxide (ITO) or an indium zinc oxide (IZO).

Further, according to different manufacturing designs, the drive line (Tx) and the sensing line (Rx) of the touch line may have different patterns. In another embodiment, as shown in FIG. 3 and FIG. 4A-4D, a panel 2 comprises a first conductive pattern 210, a second conductive pattern 220, a third conductive pattern 230, and an insulation pattern 240. Specifically, the first conductive pattern 210 is located on the foregoing substrate 100, and description of the foregoing embodiment may be referred to for details of the substrate 100, which are not described herein again.

The first conductive pattern 210 may comprise a plurality of first portions 212 and a plurality of second portions 214. For example, the plurality of first portions 212 and a plurality of second portions 214 may be provided in pairs in a sensing area 101 of the substrate 100 at intervals; each pair of the first portion 212 and the second portion 214 may be used as, for example, a touch electrode of a drive line (Tx) in a first direction X. In addition, the first conductive pattern 210 may further comprise a third portion 216 and a fourth portion 218. The third portion 216 and the fourth portion 218 may be provided in pairs in a sensing area 101 of the substrate 100; each pair of the third portion 216 and the fourth portion 218 may be used as, for example, a touch electrode of a sensing line (Rx) in a second direction Y. That is, in this embodiment, the first portion 212 and the second portion 214 are two adjacent first sensing portions provided along the first direction X at intervals, and the third portion 216 and the fourth portion 218 are two adjacent second sensing portions provided along the second direction Y at intervals.

In addition, the first conductive pattern 210 may further comprise a connection portion 217 and a first pad portion 219. The connection portion 217 and the first pad portion 219 are preferably located in a peripheral circuit area 102 of the substrate 100, and a connection portion 137 is connected to one of the first portion 212 and the second portion 214 (for example, the second portion 214). In other words, the connection portion 137 is electrically connected to, for example, a touch electrode of the drive line (Tx) to be used as a line segment extending from the sensing area 101 to the peripheral circuit area 102. The first pad portion 219 is provided corresponding to the connection portion 217 to be used as, for example, a connection pad of an output line. The first conductive pattern 210 is preferably made by a material comprising a transparent conductive material, for example, an indium tin oxide (ITO) or an indium zinc oxide (IZO).

The second conductive pattern 220 connects between the first portion 212 and the second portion 214. Specifically, the second conductive pattern 220 is located on the substrate 100, and may comprise a plurality of first bridging portions 222. The plurality of first bridging portions 222 is located in the sensing area 101 of the substrate 100, and one first bridging portion 222 is configured to connect between one pair of the first portion 212 and the second portion 214. That is, the first bridging portion 222 is located between the corresponding portion 212 and the second portion 214, and preferably, two ends of the first bridging portion 222 respectively partially cover on adjacent sides of the first portion 212 and the second portion 214 to be electrically connected to the first portion 212 and the second portion 214, so that two adjacent first sensing portions (that is, the first portion 212 and the second portion 214) in a same column are electrically connected to each other to become, for example, the drive line (Tx) extending along the first direction X of the touch line.

In addition, the second conductive pattern 220 further comprises a line portion 224 to be connected to the connection portion 217 and the first pad portion 219. For example, the line portion 224 is located in the peripheral circuit area 102 of the substrate 100 to be used as an output line connected to the connection portion 217 and the first pad portion 219. That is, preferably, two ends of the line portion 224 respectively partially cover on corresponding side edges of the connection portion 217 and the first pad portion 219 to be electrically connected to the connection portion 217 and the first pad portion 219. The second conductive pattern 220, for example, is made by a material comprising a metal material, for example, copper, aluminum, titanium, molybdenum, silver, or gold, to reduce a resistance value of the bridging portion 222 or the line portion 224 that connects between adjacent touch electrodes (for example, 212 and 214). In other words, according to the present embodiment, by using a metal layer that forms peripheral circuits and is also used as a bridging portion that connects between adjacent touch electrodes, a resistance value of the bridging portion is effectively reduced in a case in which manufacturing procedures are not additionally added, and manufacturing steps are simplified.

The insulation pattern 240 is located on the second conductive pattern 220 and substantially covers a side surface of the second conductive pattern 220, and a horizontal distance d between an outer side surface 242a of the insulation pattern 240 and an inner side surface 242b adjacent to the second conductive pattern 220 is less than about 3 micrometers. Specifically, the insulation pattern 240 may comprise a plurality of first insulation portions 242, and each insulation portion 242 is located on the corresponding first bridging portion 222 and substantially covers a side surface of the first bridging portion 222, to isolate electric contact between the first bridging portion 222 and subsequent other conductive layers. A horizontal distance between an outer side surface of the first insulation portion 242 and an inner side surface adjacent to the corresponding first bridging portion 222 is less than about 3 micrometers, and the first insulation portion 242 does not completely cover the first portion 212 and the second portion 214.

In addition, the insulation pattern 240 may further comprise a second insulation portion 244, which is located on the line portion 224 and substantially covers a side surface of the line portion 224. A horizontal distance between an outer side surface of the second insulation portion 244 and an inner side surface of the second insulation portion 244 adjacent to the line portion 224 may also be less than about 3 micrometers, and the second insulation portion 244 does not completely cover the connection portion 217 and the first pad portion 219, and an uncovered portion of the first pad portion 219 may be electrically connected to subsequent other conductive layers. Similar to the embodiment of FIG. 1, the insulation pattern 240 preferably is formed by thermally treating a mask pattern of an insulation material used for patterning the second conductive pattern 220, to simplify manufacturing steps and saving material costs. The insulation pattern 240, for example, is made by a black photoresist material or an anti-reflection material; the anti-reflection material reduces light reflection by using light scattering or interference principles. The insulation pattern 240, for example, is made by a material including a pigment, a dye, carbon black, a carbon nanotube, titanium nitride, a quantum dot, and zirconia, but the present invention is not limited thereto.

The third conductive pattern 230 is located on the substrate 100, and comprises a plurality of second bridging portions 232, wherein each second bridging portion 232 at least partially crosses over the corresponding first insulation portion 242 and is connected to the corresponding third portion 216 and fourth portion 218. Specifically, the second bridging portion 232 is located between the corresponding third portion 216 and fourth portion 218, and preferably, two ends of the second bridging portion 232 respectively partially cover on adjacent sides of the third portion 216 and the fourth portion 218 to be electrically connected to the third portion 216 and the fourth portion 218, so that two adjacent second sensing portions (that is, the third portion 216 and the fourth portion 218) in a same column are electrically connected to each other, to become, for example, the sensing line (Rx) extending along the second direction Y of the touch line.

In addition, the third conductive pattern 230 may further comprise a second pad portion 234 to be electrically connected to the first pad portion 219. Specifically, the second pad portion 234 is electrically connected to a portion that is not covered by the second insulation portion 244 of the first pad portion 219, to be electrically connected to the line portion 224 and form, for example, an output line in the peripheral circuit area 102. In an embodiment, the third conductive pattern 230 is preferably made by a material comprising a metal material, for example, copper, aluminum, titanium, molybdenum, silver, or gold, to reduce a resistance value of the bridging portion 232 or the second pad portion 234 that connects between adjacent touch electrodes (for example, third portion 216 and fourth portion 218.) In another embodiment, the third conductive pattern 230 may be made by a material comprising a transparent conductive material, for example, an indium tin oxide (ITO) or an indium zinc oxide (IZO), but the present invention is not limited thereto.

Figure 3:
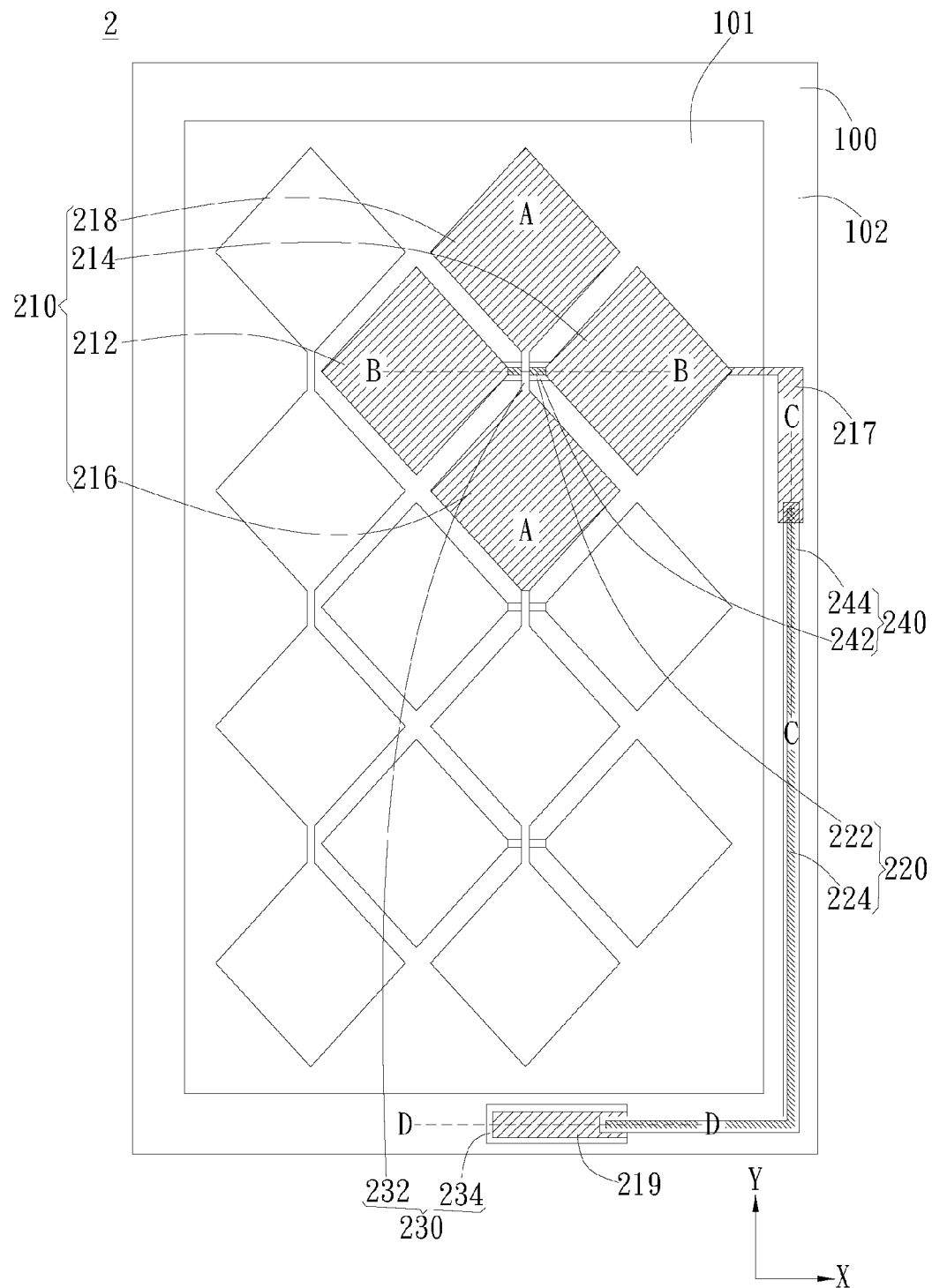
FIG. 3 is a schematic diagram of a panel of another embodiment of the present invention.
Figure 4A:
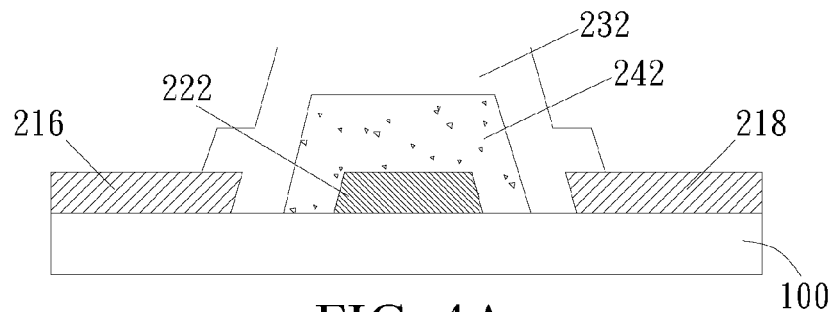
FIG. 4A to FIG. 4D respectively are schematic sectional views along lines AA, BB, CC, and DD of FIG. 3.
Figure 4B:
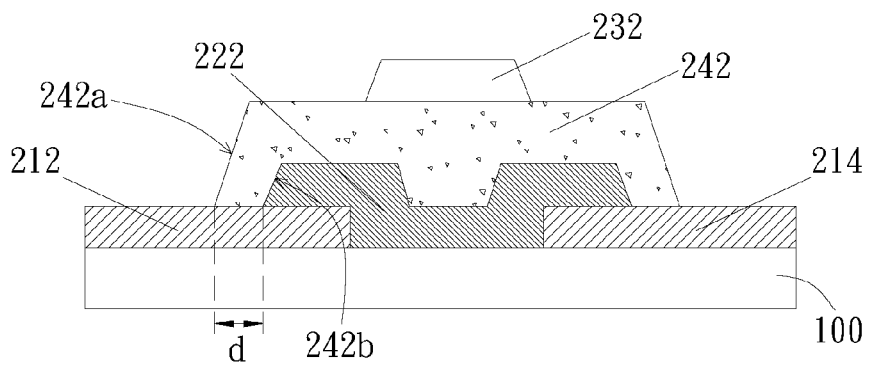
Figure 4C:
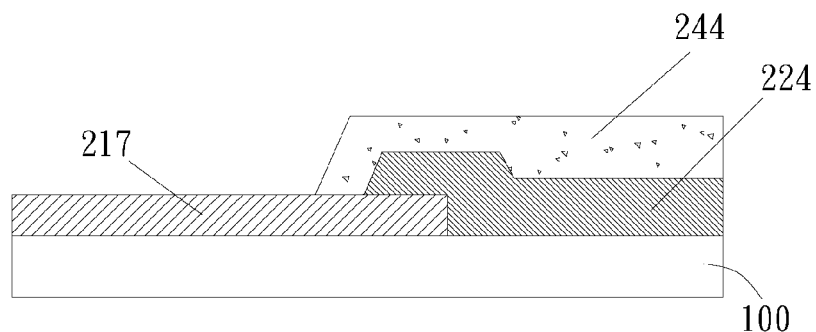
Figure 4D:
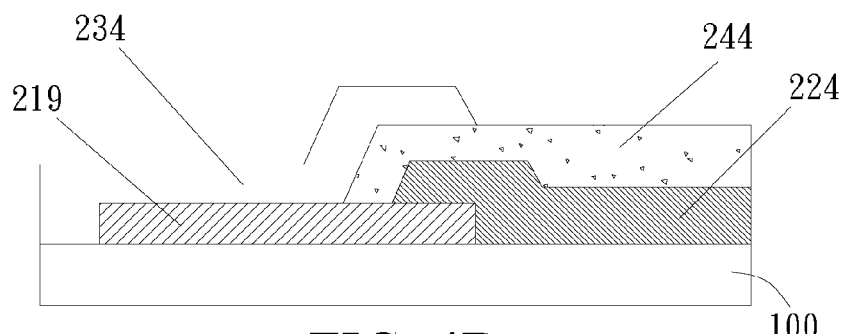

As shown in the foregoing embodiment in FIG. 1 or FIG. 3, another embodiment of the present invention also provides a method for manufacturing a panel, comprising forming a first conductive pattern (for example, 110 or 210), forming a second conductive pattern (for example, 120 or 220), and forming an insulation pattern (for example, 140 or 240) located on the second conductive pattern and substantially covering a side surface of the second conductive pattern. The manufacturing method may further comprise forming a third conductive pattern (for example, 130 or 230), to complete, for example, the panel 1 or 2 shown in FIG. 1 or 3.

Specifically, the step of forming the first conductive pattern may comprise, for example, sputtering (or coating), photolithography, etching, and printing manufacturing procedures, to form the first conductive pattern 110 shown in FIG. 1 or the first conductive pattern 210 shown in FIG. 3. In the embodiment shown in FIG. 1, the step of forming the first conductive pattern 110 may comprise forming the first portion 112 and the second portion 114 that are used as electric contacts of touch electrodes, and may further comprise forming the third portion 116 and the fourth portion 118 that are used as electric contacts of peripheral circuits. In the embodiment shown in FIG. 3, the step of forming the first conductive pattern 210 comprises forming the first portion 212 and the second portion 214 that are used as, for example, a touch electrode of the drive line (Tx), and may further comprise forming the third portion 216 and the fourth portion 218 that are used as, for example, a touch electrode of the sensing line (Rx), and the connection portion 217 used as a partial line segment of a peripheral output line and the first pad portion 219.

The step of forming the second conductive pattern may comprise, for example, sputtering (or deposition, or coating), photolithography, etching, and printing manufacturing procedures, to form the second conductive pattern 120 shown in FIG. 1 or the second conductive pattern 220 shown in FIG. 3. In the embodiment shown in FIG. 1, the step of forming the second conductive pattern 120 comprises forming the first bridging portion 122 connecting between the first portion 112 and the second portion 114, and may further comprise forming the line portion 124 connected to the third portion 116 and the fourth portion 118. In the embodiment shown in FIG. 3, the step of forming the second conductive pattern 220 comprises forming the first bridging portion 222 connecting between the first portion 212 and the second portion 214, and may further comprise forming the line portion 224 connected to the first pad portion 219 and the connection portion 217.

The step of forming the insulation pattern may comprise thermally treating the foregoing mask pattern used for forming the second conductive pattern, to form, for example, the insulation pattern 140 shown in FIG. 1 or the insulation pattern 240 shown in FIG. 3 (as stated in detailed description of FIG. 5A-5D). In the embodiment shown in FIG. 1, the step of forming the insulation pattern 140 comprises forming the first insulation portion 142 located on the first bridging portion 122 and substantially covering the side surface of the first bridging portion 122, and may further comprise forming the second insulation portion 144 located on the line portion 124 and substantially covering the side surface of the line portion 124. In the embodiment shown in FIG. 3, the step of forming the insulation pattern 240 comprises forming the first insulation portion 242 located on the first bridging portion 222 and substantially covering the side surface of the first bridging portion 222, and may further comprise forming the second insulation portion 244 located on the line portion 224 and substantially covering the side surface of the line portion 224.

The step of forming the third conductive pattern may comprise, for example, sputtering (or deposition, or coating), photolithography, etching, and printing manufacturing procedures, to form the third conductive pattern 130 shown in FIG. 1 or the third conductive pattern 230 shown in FIG. 3. In the embodiment shown in FIG. 1, the step of forming the third conductive pattern 130 comprises forming a plurality of first sensing portions 132, a plurality of second sensing portions 134, and a plurality of second bridging portions 136 connecting between adjacent sensing portions 134, and may further comprise forming the connection portion 137 electrically connected to one of the third portion 116 and the first sensing portion 132, and forming the pad portion 138 electrically connected to the fourth portion 118. In the embodiment shown in FIG. 3, the step of forming the third conductive pattern 230 comprises forming the second bridging portion 232 connecting between the third portion 216 and the fourth portion 218, and may further comprise forming the second pad portion 234 electrically connected to the first pad portion 219.

Figure 5A:
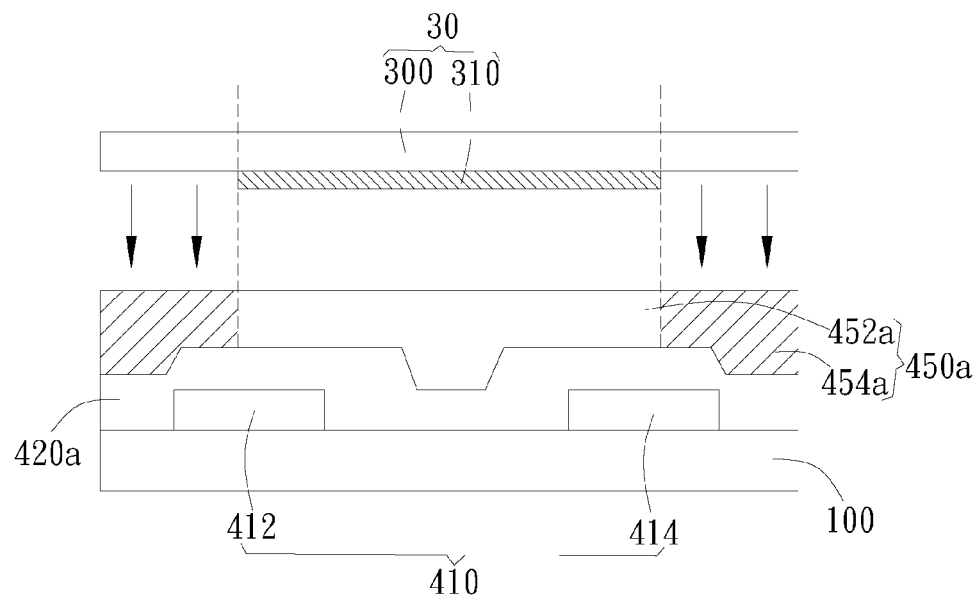
FIG. 5A, FIG. 5C, and FIG. 5D are schematic diagrams of a method for manufacturing a panel of an embodiment of the present invention.

In at least one embodiment of the present invention, the step of forming the second conductive pattern may be integrated with the step of forming the insulation pattern, to simplify manufacturing steps and save material costs. Refer to FIG. 5A to FIG. 5D subsequently for details of integration. As shown in FIG. 5A, a step of forming a second conductive pattern 420 comprises forming a second conductive layer 420a on a first conductive pattern 410, to cover a first portion 412 and a second portion 414. For example, the first conductive pattern 410 of this embodiment may correspond to the first conductive pattern 110 or 210 in FIG. 1 or FIG. 3, and the first portion 412 and the second portion 414 respectively correspond to the first portion 112 or 212 and the second portion 114 or 214. The second conductive layer 420a preferably is a metal layer that is formed by a metal material (for example, copper, aluminum, titanium, molybdenum, silver, or gold) and formed on a substrate 100 by film forming technologies such as sputtering and deposition.

Next, a photolithography technology is used to form a mask pattern (for example, 450 shown in FIG. 5C) on the second conductive layer 420a, and the second conductive layer 420a is etched by using the mask pattern 450 as a mask to form the second conductive pattern 420. The mask pattern 450 may be formed by a positive or negative photoresist. For example, as shown in FIG. 5A, in an embodiment, by coating a positive photoresist layer 450a on the second conductive layer 420a and manufacturing procedures such as exposure and development in cooperation with a photomask 30, the positive photoresist layer 450a is enabled to be the mask pattern 450. Specifically, the photomask 30 comprises a photomask substrate 300 and a photomask pattern 310 formed on the photomask substrate 300. The photomask pattern 310 may be formed by chromium, and is configured to prevent exposure energy from passing there through. An unexposed area 452a and an exposed area 454a are formed after the positive photoresist layer 450a is exposed by the photomask 30, and the developed exposed area 454a is removed and the unexposed area 452a is kept as the mask pattern 450, so that the mask pattern 450 defines a range of the second conductive pattern 420.

Figure 5B:
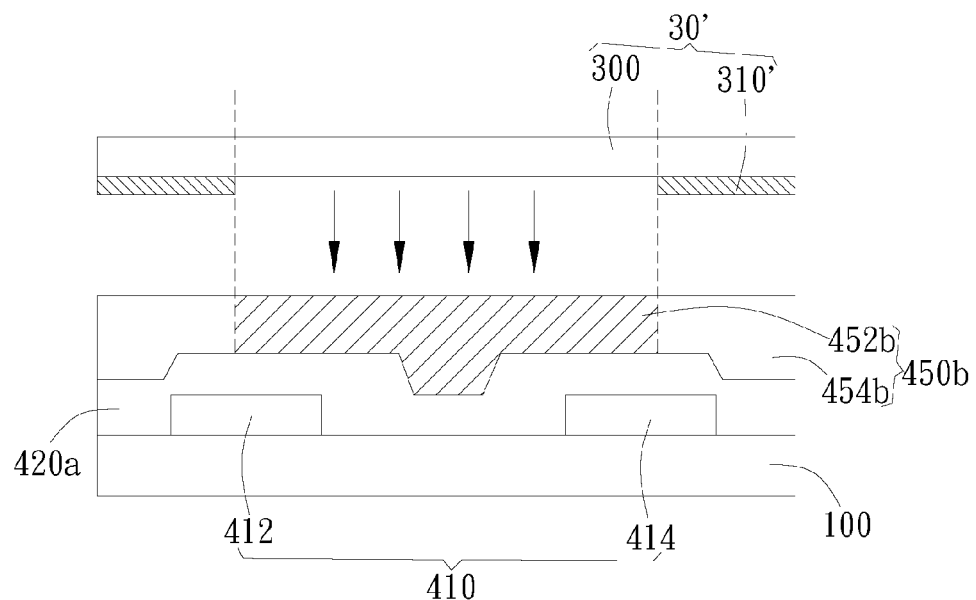
FIG. 5B is a schematic diagram of a varied embodiment of FIG. 5A.

In another embodiment, as shown in FIG. 5B, by coating a negative photoresist layer 450b on the second conductive layer 420a and manufacturing procedures such as exposure and development in cooperation with a photomask 30', the negative photoresist layer 450b is enabled to be the mask pattern 450. Specifically, the photomask 30' comprises the photomask substrate 300 and a photomask pattern 310' formed on the photomask substrate 300. An exposed area 452b and an unexposed area 454b are formed after the negative photoresist layer 450b is exposed by the photomask 30', and the developed unexposed area 454b is removed and the exposed area 452b is kept as the mask pattern 450. That is, a portion that does not belong to the photomask pattern 310' (that is, a negative image of the photomask pattern 310') corresponds to the mask pattern 450, so that the mask pattern 450 defines a range of the second conductive pattern 420. In this embodiment, the second conductive pattern 420 defined by the mask pattern 450 corresponds to the second conductive pattern 120 or 220 of FIG. 1 or FIG. 3, and may comprise the first bridging portion 122 or 222, and may further comprise the line portion 124 or 224.

Figure 5C:
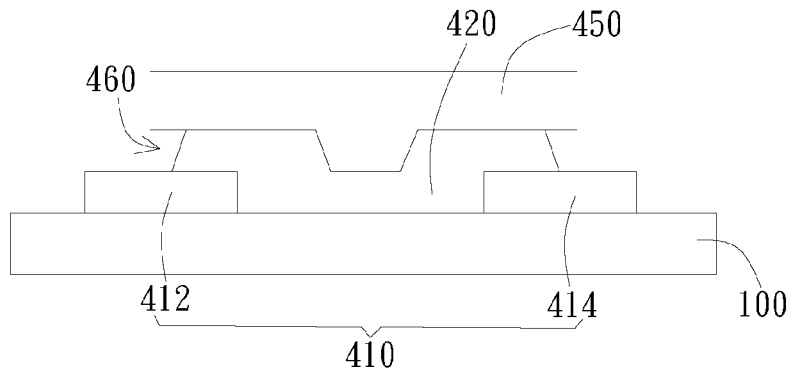

As shown in FIG. 5C, the step of etching the second conductive layer 420a by using the mask pattern 450 as mask comprises wet-etching the second conductive layer 420a, so that the second conductive pattern 420 becomes inward relative to the mask pattern 450 to form an undercutting space 460 under the mask pattern 450. Specifically, a size of the undercutting space 460 may be controlled by controlling concentration of an etching agent and etching time, so that a part of the mask pattern 450 protrudes from the second conductive pattern 420.

Figure 5D:
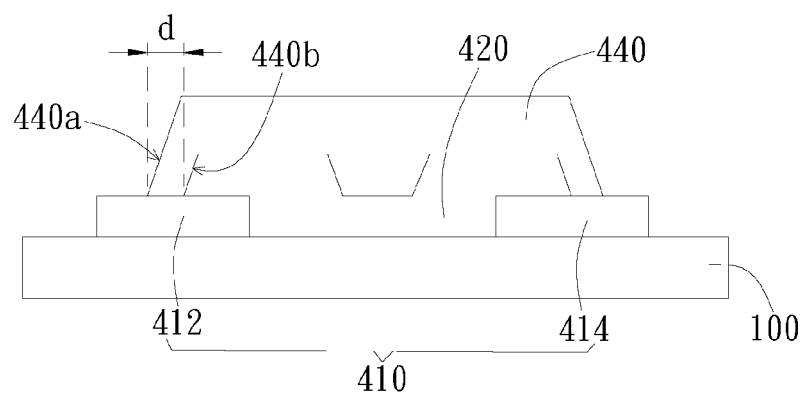

Then, as shown in FIG. 5D, the step of thermally treating the mask pattern 450 comprises thermally reflowing the mask pattern 450 to fill the undercutting space 460, so that the mask pattern 450 becomes an insulation pattern 440, and substantially not only covers an upper surface of the second conductive pattern 420 but also covers a side surface of the second conductive pattern 420. In an embodiment, a horizontal distance d between an outer side surface 440a of the insulation pattern 440 and an inner side surface 440b adjacent to the second conductive pattern 420 is less than about 3 micrometers. The insulation pattern 440 may correspond to the insulation pattern 140 or 240 of FIG. 1 or FIG. 3, and may comprise the first insulation portion 142 or 242, and may further comprise the second insulation portion 144 or 244. In this embodiment, the mask pattern 450, for example, is made by a black photoresist material or an anti-reflection material; the anti-reflection material reduces light reflection by using light scattering or interference principles. The mask pattern 450, for example, is made by a material including a pigment, a dye, carbon black, a carbon nanotube, titanium nitride, a quantum dot, and zirconia, but the present invention is not limited thereto, so that the insulation pattern 440 formed by thermally treating the mask pattern 450 can have a light shield effect to remove an additional manufacturing procedure of forming a light shield layer.

Figure 5E:
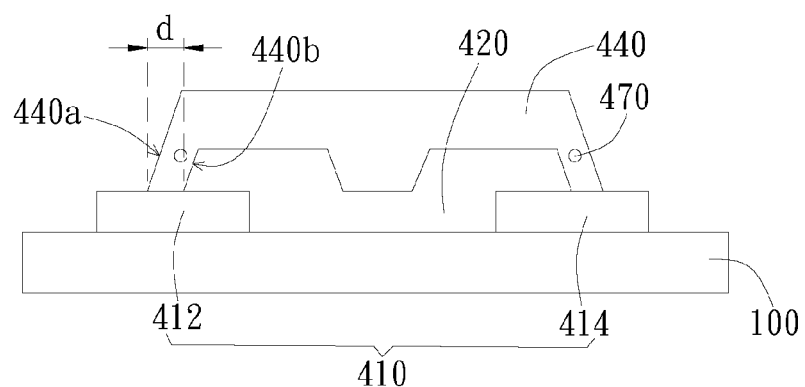
FIG. 5E is a schematic diagram of a varied embodiment of FIG. 5D.

In another embodiment, as shown in FIG. 5E, according to a size of the undercutting space 460 formed by an etching manufacturing procedure, a condition of a thermal reflowing manufacturing procedure and a thickness of the mask pattern 450. After thermal reflowing, the undercutting space may possibly not be filled up by an insulation material (for example, a black photoresist material), to form at least one remaining space 470 adjacent to a side edge of the insulation pattern 440 and a side edge of the second conductive pattern 420. In other words, in the embodiments of FIG. 1 and FIG. 3, according to actual manufacturing conditions, the remaining space 470 shown in FIG. 5E may be possibly formed adjacent to side edges of the first insulation portions 142 and 242 and side edges of the first bridging portions 122 and 222, or adjacent to the side edges of the second insulation portions 144 and 244 and the side edges of the line portions 124 and 224.

The present invention is described through the foregoing embodiments; however, these embodiments are intended for an exemplary objective, rather than limit the present invention. A person skilled in the art should know that other modifications of exemplified embodiments may be made to embodiments specifically described herein without departing from the spirit of the present invention. Therefore, the scope of the present invention also covers such modifications and is limited only to the appended claims.

What is claimed is:

1. A panel, comprising:
a first conductive pattern comprising a first portion and a second portion;
a second conductive pattern comprises a first bridging portion connecting between the first portion and the second portion;
an insulation pattern comprises a first insulation portion located on the first bridging portion of the second conductive pattern and covering a side surface of the first bridging portion, wherein a horizontal distance between an outer side surface of the first insulation portion and an inner side surface adjacent to the first bridging portion is less than 3 micrometers; and
a third conductive pattern comprising two first sensing portions, two second sensing portions, and a second bridging portion, the two first sensing portions are respectively electrically connected to the first portion and the second portion, the second bridging portion at least partially crosses over the first insulation portion, and the second bridging portion is connected to the two second sensing portions.

2. The panel according to claim 1, wherein the first conductive pattern and the third conductive pattern comprise transparent conductive materials.

3. The panel according to claim 1, wherein the first conductive pattern further comprises a third portion and a fourth portion, the second conductive pattern further comprises a line portion connected to the third portion and the fourth portion, and the insulation pattern further comprises a second insulation portion located on the line portion and substantially covering a side surface of the line portion.

4. The panel according to claim 3, wherein the third conductive pattern further comprises a connection portion and a pad portion; the connection portion is connected to the third portion and one of the two first sensing portions; and the pad portion is electrically connected to the fourth portion.

5. The panel according to claim 1, wherein the first conductive pattern further comprises a third portion and a fourth portion, the third conductive pattern at least partially crosses over the insulation pattern, and the third conductive pattern is electrically connected to the third portion and the fourth portion.

6. The panel according to claim 5, wherein the first conductive pattern comprises a transparent conductive material, and the third conductive pattern comprises a transparent conductive material or a metal material.

7. The panel according to claim 5, wherein the first conductive pattern further comprises a connection portion and a first pad portion, the connection portion is connected to one of the first portion and the second portion, the second conductive pattern further comprises a line portion connected to the connection portion and the first pad portion, the insulation pattern further comprises a second insulation portion, and the second insulation portion is located on the line portion and covers a side surface of the line portion.

8. The panel according to claim 7, wherein the third conductive pattern comprises the second bridging portion, the second bridging portion at least partially crosses over the first insulation portion and is connected to the third portion and the fourth portion, and the third conductive pattern further comprises a second pad portion electrically connected to the first pad portion.

9. The panel according to claim 1, wherein the first conductive pattern comprises a transparent conductive material, and the second conductive pattern comprises a metal material.

10. The panel according to claim 1, wherein the insulation pattern comprises a black photoresist material.

11. The panel according to claim 1, wherein at least one remaining space is formed adjacent to a side edge of the insulation pattern and a side edge of the second conductive pattern.

12. A panel, comprising:
a first conductive pattern comprising a first portion, a second portion, a third portion, a fourth portion, a connection portion, and a first pad portion, wherein the connection portion is connected to one of the first portion and the second portion;
a second conductive pattern comprises a first bridging portion and a line portion, wherein the first bridging portion connects between the first portion and the second portion, and the line portion connects to the connection portion and the first pad portion;
a third conductive pattern electrically connected to the third portion and the fourth portion; and
an insulation pattern comprises a first insulation portion and a second insulation portion, wherein the first insulation portion is located on the first bridging portion of the second conductive pattern and covering a side surface of the first bridging portion, a horizontal distance between an outer side surface of the first insulation portion and an inner side surface adjacent to the first bridging portion is less than 3 micrometers, and the second insulation portion is located on the line portion and covers a side surface of the line portion;
wherein the third conductive pattern at least partially crosses over the insulation pattern.

13. The panel according to claim 12, wherein the third conductive pattern comprises a second bridging portion, the second bridging portion at least partially crosses over the first insulation portion and is connected to the third portion and the fourth portion, and the third conductive pattern further comprises a second pad portion electrically connected to the first pad portion.

* * * * *